(12) United States Patent
Ong et al.

(10) Patent No.: US 9,373,609 B2
(45) Date of Patent: Jun. 21, 2016

(54) BUMP PACKAGE AND METHODS OF FORMATION THEREOF

(71) Applicant: Infineon Technologies AG, Neubiberg (DE)

(72) Inventors: Meng Tong Ong, Melaka (MY); Thiam Huat Lim, Melaka (MY); Kok Chai Goh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 515 days.

(21) Appl. No.: 13/655,228

(22) Filed: Oct. 18, 2012

(65) Prior Publication Data

US 2014/0110835 A1    Apr. 24, 2014

(51) Int. Cl.
*H01L 23/48* (2006.01)
*H01L 23/52* (2006.01)
(Continued)

(52) U.S. Cl.
CPC .......... *H01L 25/50* (2013.01); *H01L 21/78* (2013.01); *H01L 24/11* (2013.01); *H01L 24/13* (2013.01); *H01L 24/14* (2013.01); *H01L 24/24* (2013.01); *H01L 24/27* (2013.01); *H01L 24/29* (2013.01); *H01L 24/30* (2013.01); *H01L 24/92* (2013.01); *H01L 24/96* (2013.01); *H01L 25/072* (2013.01); *H01L 25/16* (2013.01); *H01L 2224/0401* (2013.01); *H01L 2224/04026* (2013.01); *H01L 2224/05553* (2013.01); *H01L 2224/05554* (2013.01); *H01L 2224/05555* (2013.01); *H01L 2224/11003* (2013.01); *H01L 2224/114* (2013.01); *H01L 2224/1112* (2013.01); *H01L 2224/1161* (2013.01); *H01L 2224/11826* (2013.01); *H01L 2224/13006* (2013.01); *H01L 2224/1316* (2013.01); *H01L 2224/13019* (2013.01); *H01L 2224/1357* (2013.01); *H01L 2224/13147* (2013.01); *H01L 2224/13155* (2013.01); *H01L 2224/13157* (2013.01); *H01L 2224/13171* (2013.01); *H01L 2224/13562* (2013.01); *H01L 2224/13611* (2013.01); *H01L 2224/13618* (2013.01);
(Continued)

(58) Field of Classification Search
USPC ................. 257/737, E21.506, E23.021
See application file for complete search history.

(56) References Cited

U.S. PATENT DOCUMENTS 3,986,255 A    10/1976  Mandal
5,904,555 A *  5/1999   Darbha ........... H01L 21/78
                                         257/E21.599

(Continued)

FOREIGN PATENT DOCUMENTS

CN          1359147 A     7/2002
CN        101252092 A     8/2008
(Continued)

OTHER PUBLICATIONS

Wojnowski, Maciej et al., "Package Trends for Today's and Futre mm-Wave Applications", 38th European Microwave Conference; 2008, 55 pages.

*Primary Examiner* — Marc Armand
*Assistant Examiner* — Wilner Jean Baptiste
(74) *Attorney, Agent, or Firm* — Slater Matsil, LLP

(57) ABSTRACT

In accordance with an embodiment of the present invention, a semiconductor package includes a semiconductor chip and a bump. The semiconductor chip has a contact pad on a major surface. The bump is disposed on the contact pad of the semiconductor chip. A solder layer is disposed on sidewalls of the bump.

27 Claims, 13 Drawing Sheets

(51) Int. Cl.
  *H01L 29/40* (2006.01)
  *H01L 25/00* (2006.01)
  *H01L 25/07* (2006.01)
  *H01L 25/16* (2006.01)
  *H01L 21/78* (2006.01)
  *H01L 23/00* (2006.01)

(52) U.S. Cl.
  CPC ........ *H01L 2224/13639* (2013.01); *H01L 2224/13644* (2013.01); *H01L 2224/13655* (2013.01); *H01L 2224/13669* (2013.01); *H01L 2224/1403* (2013.01); *H01L 2224/14181* (2013.01); *H01L 2224/14505* (2013.01); *H01L 2224/24101* (2013.01); *H01L 2224/24137* (2013.01); *H01L 2224/2518* (2013.01); *H01L 2224/27003* (2013.01); *H01L 2224/274* (2013.01); *H01L 2224/2712* (2013.01); *H01L 2224/2761* (2013.01); *H01L 2224/27826* (2013.01); *H01L 2224/28105* (2013.01); *H01L 2224/29006* (2013.01); *H01L 2224/2916* (2013.01); *H01L 2224/29019* (2013.01); *H01L 2224/2957* (2013.01); *H01L 2224/29155* (2013.01); *H01L 2224/29157* (2013.01); *H01L 2224/29171* (2013.01); *H01L 2224/29562* (2013.01); *H01L 2224/29611* (2013.01); *H01L 2224/29618* (2013.01); *H01L 2224/29639* (2013.01); *H01L 2224/29644* (2013.01); *H01L 2224/29655* (2013.01); *H01L 2224/29669* (2013.01); *H01L 2224/3003* (2013.01); *H01L 2224/30181* (2013.01); *H01L 2224/30505* (2013.01); *H01L 2224/92133* (2013.01); *H01L 2224/92135* (2013.01); *H01L 2224/94* (2013.01); *H01L 2224/96* (2013.01); *H01L 2924/01322* (2013.01); *H01L 2924/12032* (2013.01); *H01L 2924/12042* (2013.01); *H01L 2924/1301* (2013.01); *H01L 2924/1305* (2013.01); *H01L 2924/1306* (2013.01); *H01L 2924/13055* (2013.01); *H01L 2924/13062* (2013.01)

(56) References Cited

U.S. PATENT DOCUMENTS

| | | | |
|---|---|---|---|
| 7,579,692 | B2 | 8/2009 | Matsushima et al. |
| 2004/0124514 | A1* | 7/2004 | Ohkura ............ H01L 23/3114 257/678 |
| 2007/0296077 | A1* | 12/2007 | Moline ..................... 257/712 |
| 2008/0157250 | A1 | 7/2008 | Yang et al. |
| 2008/0197480 | A1* | 8/2008 | Yang et al. ............... 257/698 |
| 2010/0233856 | A1 | 9/2010 | Nogi et al. |
| 2011/0186982 | A1 | 8/2011 | Kitani et al. |
| 2011/0297423 | A1* | 12/2011 | Noh ................. H05K 3/4007 174/250 |

FOREIGN PATENT DOCUMENTS

| | | |
|---|---|---|
| CN | 202394956 U | 8/2012 |
| JP | 01201930 A | 8/1989 |
| JP | 05175201 A | 7/1993 |
| JP | 0766208 A | 3/1995 |

\* cited by examiner

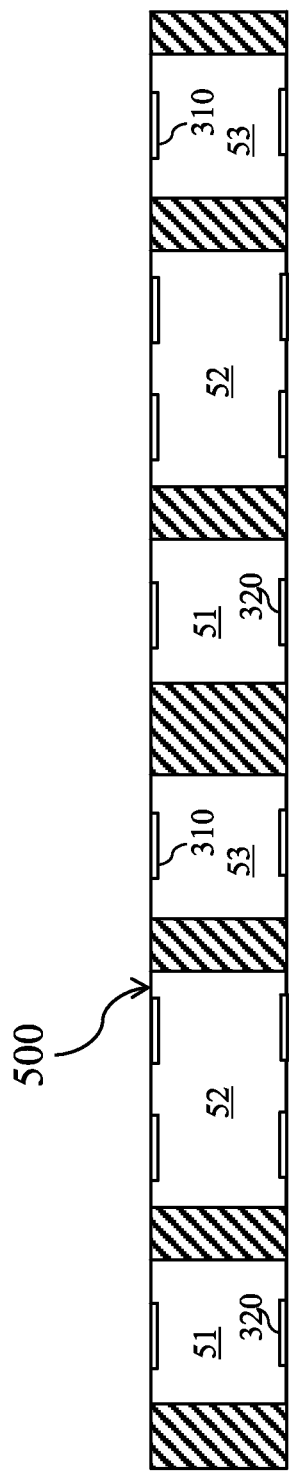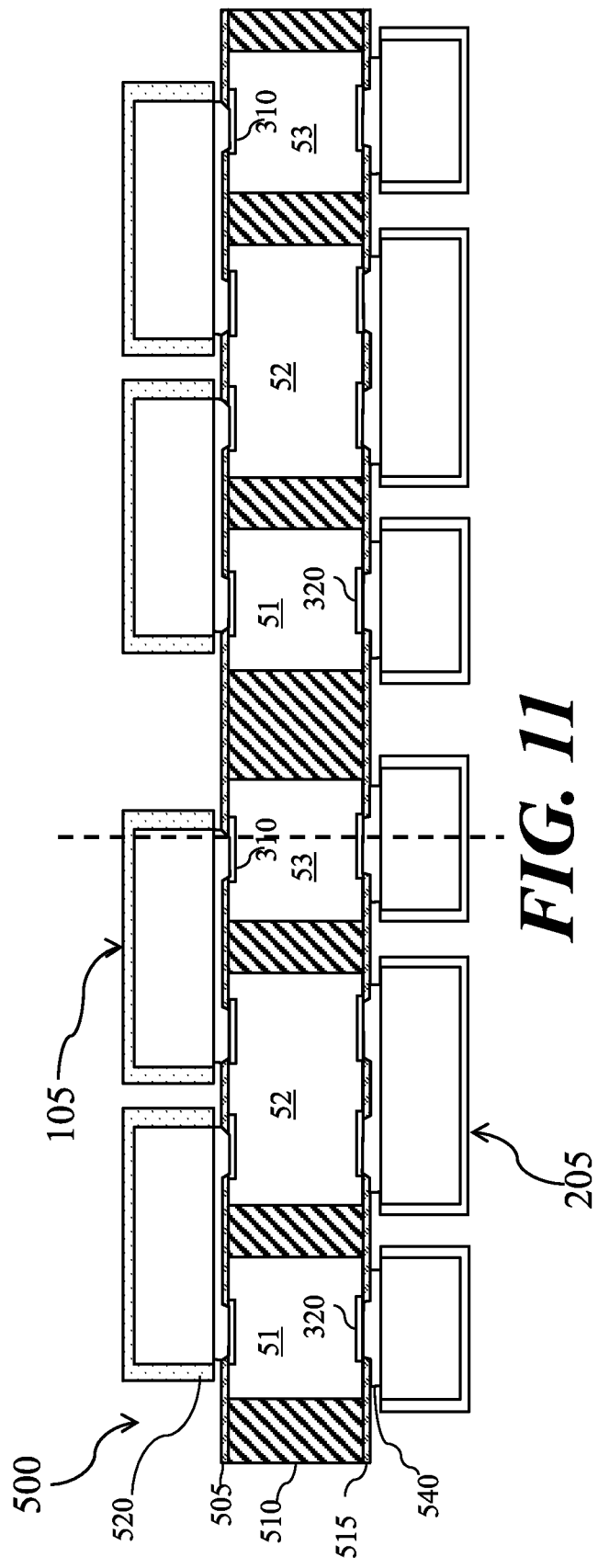

BUMP PACKAGE AND METHODS OF FORMATION THEREOF

TECHNICAL FIELD

The present invention relates generally to semiconductor packaging, and more particularly to bump package and methods of formation thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically and/or chemically treated and the semiconductor devices are physically separated to form individual dies. The individual dies are then packaged according to the package specifications. Examples of package designs include thin small leadless package, embedded wafer-level ball grid array packages, and others.

SUMMARY OF THE INVENTION

These and other problems are generally solved or circumvented, and technical advantages are generally achieved, by illustrative embodiments of the present invention.

In accordance with an embodiment of the present invention, a semiconductor package comprises a semiconductor chip having a contact pad on a major surface, a bump disposed on the contact pad, and a solder layer disposed on sidewalls of the bump.

In accordance with an alternative embodiment of the present invention, a semiconductor device comprises a semiconductor chip having a first contact pad on a first major surface and a second contact pad on a second major surface, a magnetic bump disposed on the first contact pad, and a non-magnetic bump disposed on the second contact pad.

In accordance with an embodiment of the present invention, a method of forming a semiconductor package comprises forming a plurality of chips in a substrate. The substrate has a plurality of first contacts on a first major surface and a plurality of second contacts on a second major surface. A bump frame comprising a plurality of bumps is provided. The bump frame is attached to the first major surface of the substrate. The substrate is singulated to form individual units.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor package in accordance with an embodiment of the invention, wherein FIG. 1A illustrates a cross-sectional view and FIGS. 1B and 1C illustrate top sectional views;

FIG. 2, which includes

FIG. 3, which includes

FIG. 10 illustrate a cross-sectional view of a semiconductor device after forming a reconstituted wafer comprising multiple chips in accordance with an alternative embodiment of the present invention;

FIG. 11 illustrate a cross-sectional view of a semiconductor device after attaching a first bump-frame and a second bump-frame to the reconstituted wafer in accordance with an alternative embodiment of the present invention;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of the present invention will be described using FIG. 1. Further structural embodiments will be described using FIGS. 12-15. A method of forming a semiconductor device will be described using FIGS. 2-9.

Alternative embodiments of forming the semiconductor device will be described using FIGS. 10-12, 13, 14, and 15.

Figure 1A:
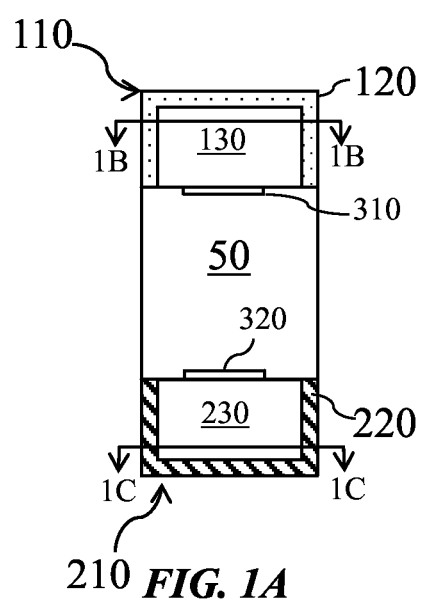
Figure 1B:
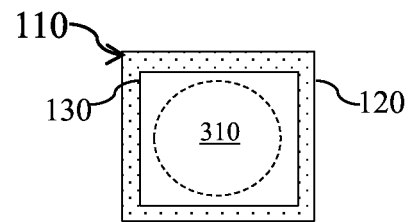
Figure 1C:
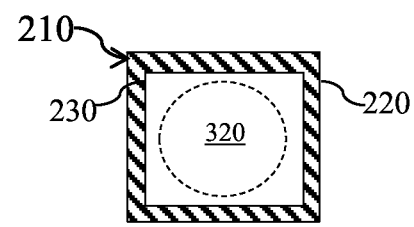

FIG. 1, which includes FIGS. 1A-1C, illustrates a semiconductor package in accordance with an embodiment of the invention. FIG. 1A illustrates a cross-sectional view and FIGS. 1B and 1C illustrate top sectional views.

Referring to FIG. 1A, a semiconductor chip 50 comprises a first contact pad 310 on a first major surface and a second contact pad 320 on an opposite second major surface. The semiconductor chip 50 may comprise a discrete semiconductor chip in one or more embodiments. Alternatively, in some embodiments, the semiconductor chip 50 may comprise an integrated circuit chip. In one or more embodiments, the semiconductor chip 50 may comprise a discrete device such as a diode, a transistor, a thyristor, a capacitor, an inductor, and others. In various embodiments, the semiconductor chip 50 may comprise a power semiconductor device, which may be a discrete device in one embodiment. In one embodiment, the semiconductor chip 50 may comprise a two terminal device such as a PIN diode or a Schottky diode. In one or more embodiments, the semiconductor chip 50 is a three terminal device such as a power metal insulator semiconductor field effect transistor (MISFET), a junction field effect transistor (JFET), bipolar junction transistor (BJT), an insulated gate bipolar transistor (IGBT), or a thyristor.

The first contact pad 310 and the second contact pad 320 may comprise pads configured to form solder contacts to the semiconductor chip 50. A first bump 110 is disposed over the first contact pad 310 of the semiconductor chip 50 while a second bump 210 is disposed over the second contact pad 320. The first bump 110 and the second bump 210 may comprise a same cross-sectional dimension as the semiconductor chip 50 in various embodiments. Alternatively, the first bump 110 and the second bump 210 may comprise a cross-sectional dimension smaller than the cross-sectional dimension of the semiconductor chip 50 but larger than the corresponding first contact pad 310 or the second contact pad 320.

As illustrated in FIGS. 1A and 1B, the first bump 110 comprises a first bump material 130 and a first solder layer 120 disposed around the first bump material 130. In one or more embodiments, the first solder layer 120 is disposed on all four sidewalls of the first bump material 130. Further, in some embodiments, the first solder layer 120 may be disposed on a top surface of the first bump material 130 such that all five surfaces of the first bump 110 are covered by the first solder layer 120.

Similarly, the second bump 210 comprises a second bump material 230 with a second solder layer 220 disposed over the second bump material 230. The second solder layer 220 may cover all the four sidewalls of the second bump material 230. Similar to the first solder layer 120, the second solder layer 220 may cover all the five surfaces of the second bump material 230.

As illustrated in FIGS. 1B and 1C, in one embodiment, the first contact pad 310 and the second contact pad 320 may have a circular or oval shape. In another embodiment, the first contact pad 310 and the second contact pad 320 may have a square or rectangular shape. In alternative embodiments, the first contact pad 310 and the second contact pad 320 may comprise other suitable shapes.

In various embodiments, the first bump material 130 may comprise a material different from the second bump material 230. In various embodiments, the first bump material 130 comprises a ferromagnetic material while the second bump material 230 comprises a non-ferromagnetic material or a non-magnetic material. Alternatively, the first bump material 130 comprises a non-ferromagnetic material or a non-magnetic material while the second bump material 230 comprises a ferromagnetic material. In one or more embodiments, the ferromagnetic material of the first bump material 130 (or the second bump material 230) comprises nickel. In alternative embodiments, the ferromagnetic material comprises iron, chromium, cobalt, and others. The ferromagnetic materials and other materials disclosed in various embodiments of the present invention may be pure metals, alloys, and compounds. Pure metals such as pure copper may include trace impurities in various embodiments.

In various embodiments, the first solder layer 120 comprises a material that forms a solderable material or alternatively bonds with a solder. Therefore, the first solder layer 120 may form a solder bond with a solder and may be attached, e.g., to a circuit board. In one or more embodiments, the first solder layer 120 comprises a material that may mix with the first bump material 130 to form a solderable material. Similarly, the second solder layer 220 may comprise a material that forms a solderable material. In various embodiments, the first solder layer 120 and the second solder layer 220 may comprise gold, silver, platinum, and others. In various embodiments, the first solder layer 120 and the second solder layer 220 may comprise tin (Sn), tin-lead (SnPb), nickel, and alloys such as tin alloys, zinc alloys, and others.

Embodiments of the present invention may have many advantages of conventional package designs. For example, embodiments of the present invention may enable automatic optical inspection as the solder joints formed using embodiments of the invention will be visible externally.

Embodiments of the invention improve the solder joint area by providing five surfaces (at least four) for joining. Further, all surfaces are solderable, which removes any requirement for aligning the chips in a particular direction. Further, embodiments of the present invention provide great flexibility by allowing flexibility in selecting the solder materials (for example, the material of the first solder layer 120, and others).

Embodiments of the invention provide the ability to identify the polarity of the pad by using a color coding. For example, the color of the first solder layer 120 may be different from the color of the second solder layer 220. In one embodiment, the first solder layer 120 may have a golden color using gold while the second solder layer 220 may have a silver color by using silver.

Embodiments of the invention enable ease of handling of bulk chips due to use of ferromagnetic materials selectively on one side. Additionally, embodiments of the invention pose no limits to scaling. Therefore, packages much smaller than current designs may be formed without significant change in cost structure.

FIGS. 2-9 illustrate a semiconductor device during various stages of fabrication in accordance with embodiments of the invention.

In various embodiments, three separate components may be fabricated, for example, in parallel or in different facilities. Two individual bump-frames and a substrate comprising the semiconductor chip may be fabricated. Alternatively, the bump-frames may be directly deposited over the front and back sides of the substrate.

FIG. 2, which includes FIGS. 2A-2D, illustrates the formation of a first bump-frame in accordance with an embodiment of the invention. FIG. 3, which includes FIGS. 3A-3D, illustrates the formation of a second bump-frame in accordance with an embodiment of the invention.

Figure 2A:
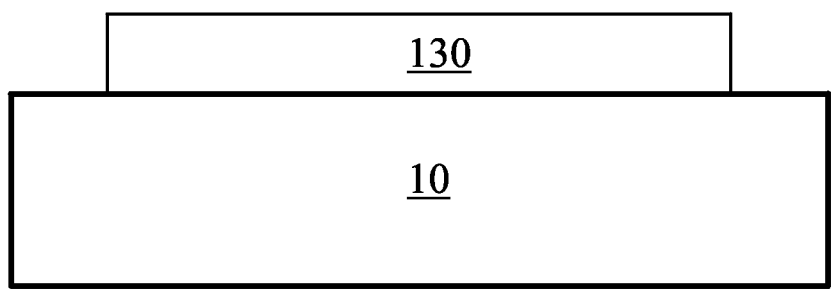
FIGS. 2A-2D, illustrates the formation of a first bump-frame in accordance with an embodiment of the invention.
Figure 3A:
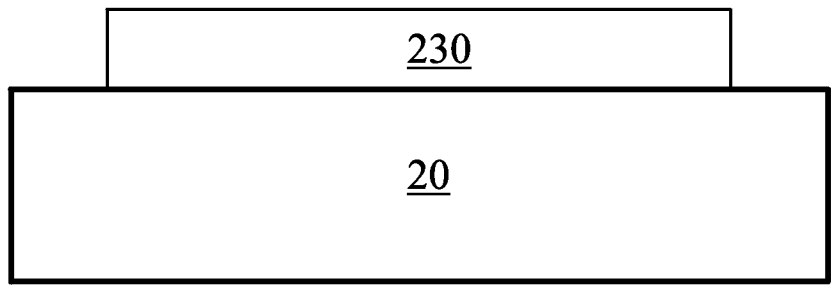
FIGS. 3A-3D, illustrates the formation of a second bump-frame in accordance with an embodiment of the invention.
Figure 2B:
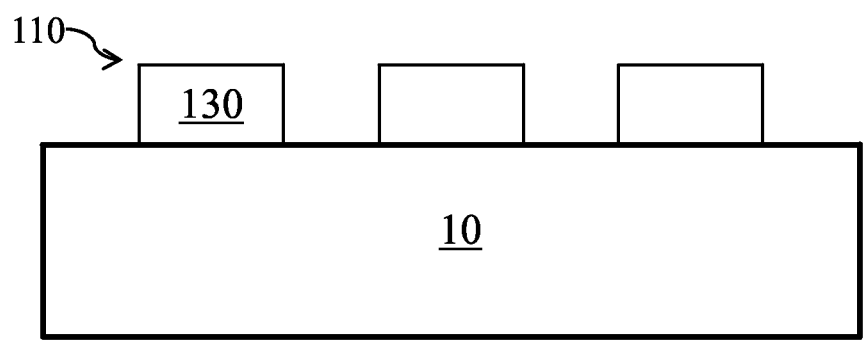
Figure 3B:
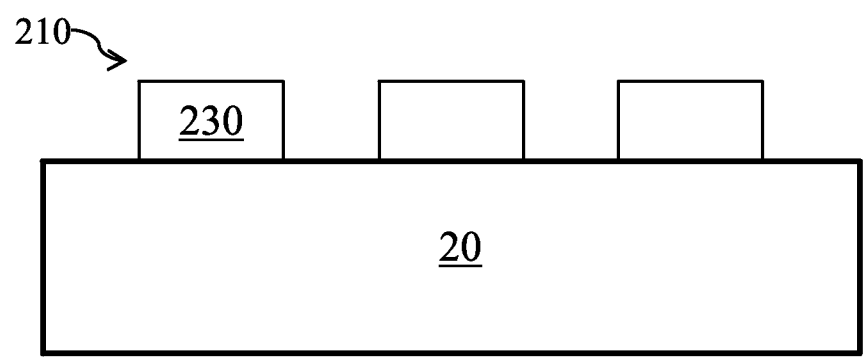

Referring to FIGS. 2A and 3A, a first bump material 130 may be positioned over a first carrier 10 and similarly, a second bump material 230 may be positioned over a second carrier 20. Referring next to FIG. 2B, the first bump material 130 may be patterned to form first bumps 110. In one embodiment, the first bump material 130 may be patterned by wet etching after a lithographic process. Alternatively, other techniques may be used to form the patterned bump-frame structure. Similarly, the second bump material 230 may be patterned to form second bumps 210 (FIG. 3B).

Figure 2C:
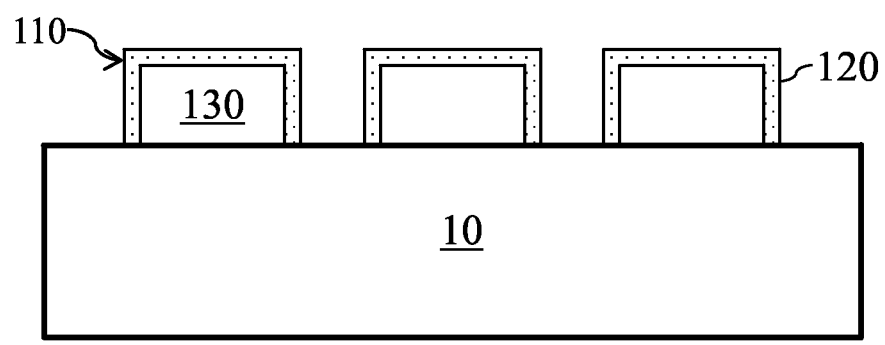
Figure 3C:
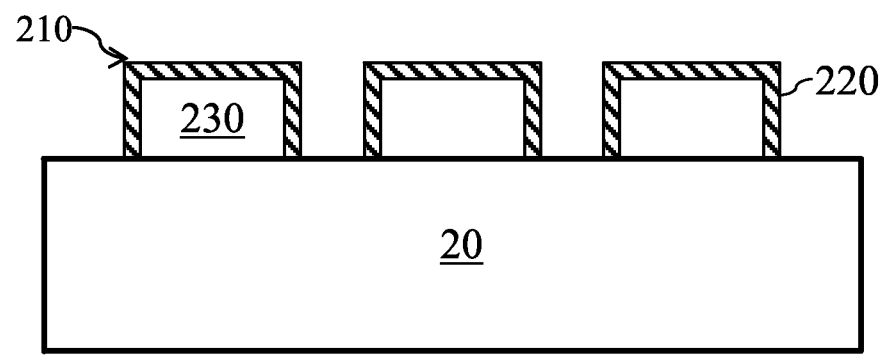

Referring to FIG. 2C, a first solder layer 120 is formed over the first bump material 130. In one or more embodiments, the first solder layer 120 is electroplated. In alternative embodiments, the first solder layer 120 may be deposited using other techniques, for example, in one embodiment, the first solder layer 120 may be sputtered onto the first bump material 130. Similarly, the second solder layer 220 is formed over the second bump material 230 (FIG. 3C).

Figure 2D:
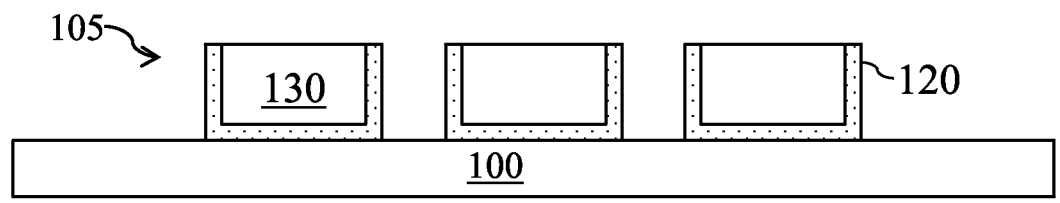
Figure 3D:
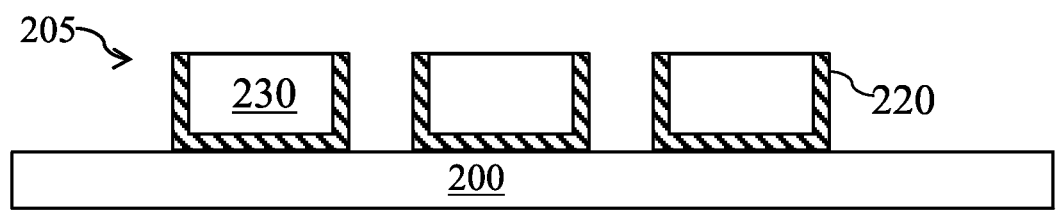

As next illustrated in FIG. 2D, the first bump-frame 105 is removed from the first carrier 10 and placed onto a first tape 100. In particular, the first bump-frame 105 is flipped so that the first bump material 130 is facing away from the first tape 100. Similarly, the second bump-frame 205 is removed from the second carrier 20 and placed onto a second tape 200.

Figure 4:
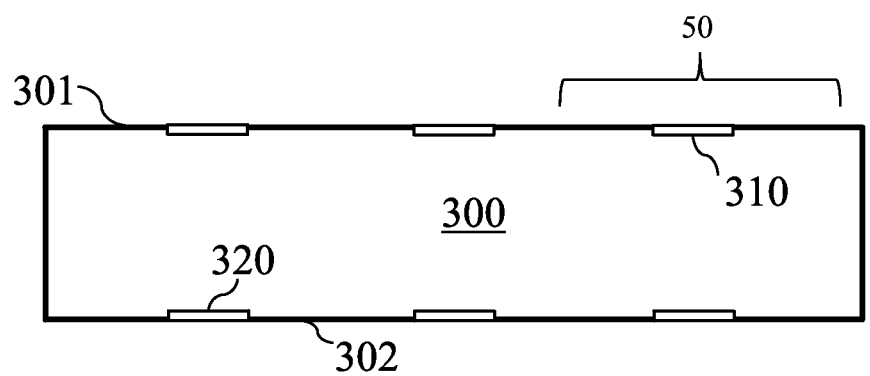
FIG. 4 illustrates a semiconductor device after fabrication in accordance with embodiments of the invention.

FIG. 4 illustrates a semiconductor device after fabrication in accordance with embodiments of the invention.

FIG. 4 may be a wafer after completion of all processing in one or more embodiments. As illustrated in FIG. 4, a substrate 300 comprising a plurality of contacts is formed. The substrate 300 comprises a plurality of semiconductor chips 50 as illustrated in the cross-sectional view of FIG. 4. The substrate 300 comprises a first major surface having a plurality of first contact pads 310 and an opposite second major surface having a plurality of second contact pads 320.

Figure 5:
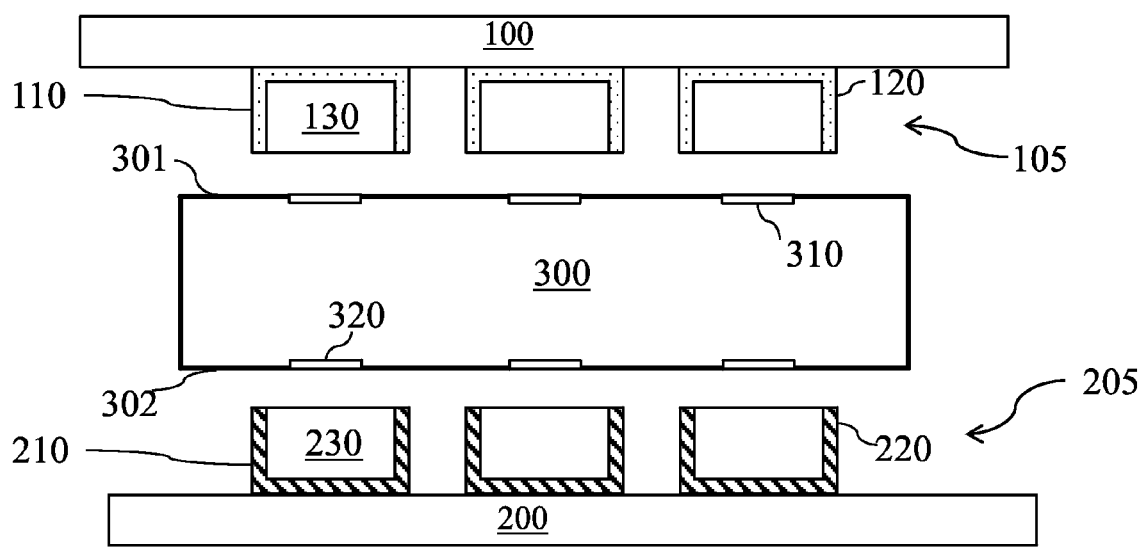
FIG. 5 illustrates a positioning process during the fabrication of the semiconductor package in accordance with an embodiment of the invention.

FIG. 5 illustrates a positioning process during the fabrication of the semiconductor package in accordance with an embodiment of the invention.

The first bump-frame 105 is inverted so that the first bump material 130 faces the first major surface of the substrate 300. In particular, each of the plurality of first contact pads 310 faces a first bump 110 of the first bump-frame 105. Similarly, each of the plurality of second contact pads 320 faces a second bump 210 of the second bump-frame 205.

Figure 6:
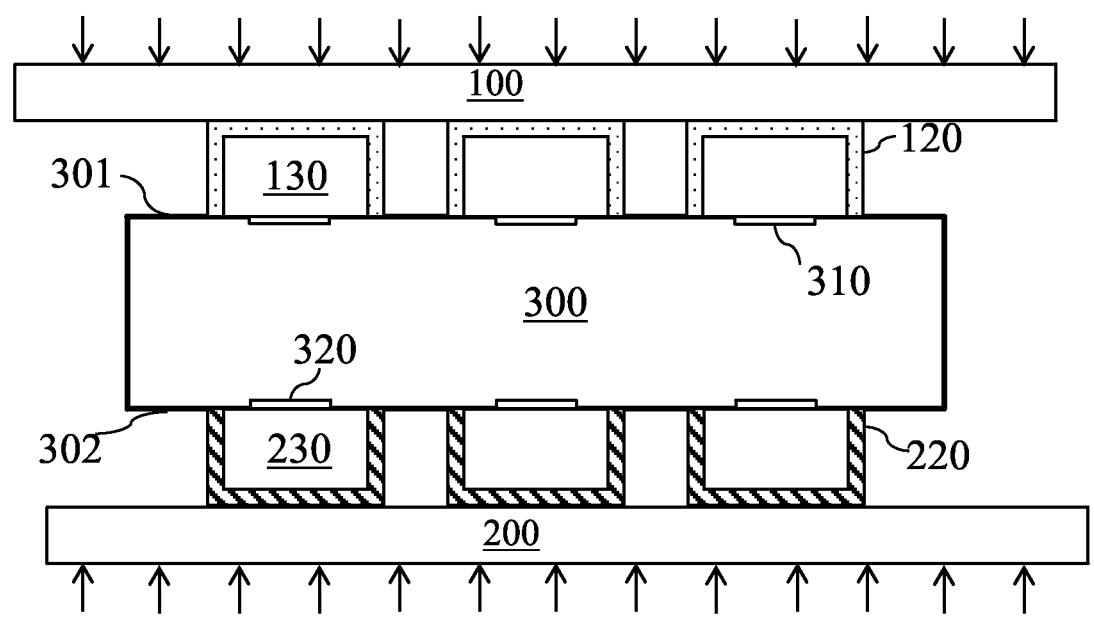
FIG. 6 illustrates a cross-sectional view of a semiconductor package during the attachment of the bumps to the substrate in accordance with embodiments of the invention.

FIG. 6 illustrates a cross-sectional view of a semiconductor package during the attachment of the bumps to the substrate in accordance with embodiments of the invention.

Referring to FIG. 6, the first bumps 110 are attached to a top surface 301 of the substrate 300 while the second bumps 210 are attached to a bottom surface 302 of the substrate 300. In various embodiments, the first bumps 110 are attached to the substrate 300 by the application of pressure and/or heat. For example, the first tape 100 may be compressed to increase the pressure at the interface between the first bump material 130 and the first contact pads 310. The first contact pads 310 and the first bump material 130 comprise solderable material in various embodiments. For example, the material of the first contact pads 310 may combine with the first bump material 130 to form a eutectic solid solution in one or more embodiments. Similarly, the material of the second contact pads 320 and the second bump material 230 may combine to form a different eutectic solid solution in another embodiment. Therefore, the substrate 300 and the first bumps 110 may be heated so as to form a solder joint between the first bumps 110 and the first contact pads 310. In various embodiments, the substrate 300 and the first bump-frame 105 may be heated to above 100° C. In alternative embodiments, the substrate 300 and the first bump-frame 105 may be heated to about 100° C. to about 400° C. In further alternative embodiments, the substrate 300 and the first bump-frame 105 may be heated to about 250° C. to about 350° C. In further alternative embodiments, the substrate 300 and the first bump-frame 105 may be heated to about 150° C. to about 250° C., for example, in a silver sintering process. Alternatively, in some embodiments, an ultrasonic joining process may be used where friction bonding may be used.

Similarly, the second bumps 210 are attached to the substrate 300 by the application of pressure and/or heat. For example, the second tape 200 may be compressed to increase the pressure at the interface between the second bump material 230 and the second contact pads 320. Further, the substrate 300 and the second bumps 210 may be heated, for example, as described above with respect to the joining of the first bump-frame 105, so as to form a solder joint between the second bumps 210 and the second contact pads 320. In various embodiments, pressure may be applied simultaneously onto the first tape 100 and the second tape 200.

In various embodiments, the first bump-frame 105, the substrate 300, and the second bump-frame 205 may be bonded together simultaneously. In alternative embodiments, the first bump-frame 105, the substrate 300, and the second bump-frame 205 may be bonded sequentially.

Figure 7:
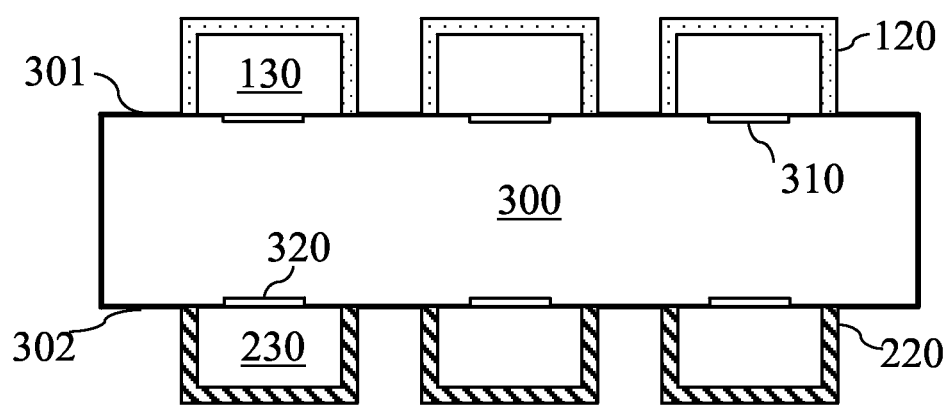
FIG. 7 illustrates a cross-sectional view of a semiconductor package after removing the tape layer from the bump frames in accordance with embodiments of the invention.

FIG. 7 illustrates a cross-sectional view of a semiconductor package after removing the tape layer from the bump frames in accordance with embodiments of the invention.

Referring to FIG. 7, the first tape layer 100 and the second tape layer 200 are removed. Thus, the first solder layer 120 and the second solder layer 220 on the top surfaces of the first bump 110 and the second bump 210 are exposed.

Figure 8:
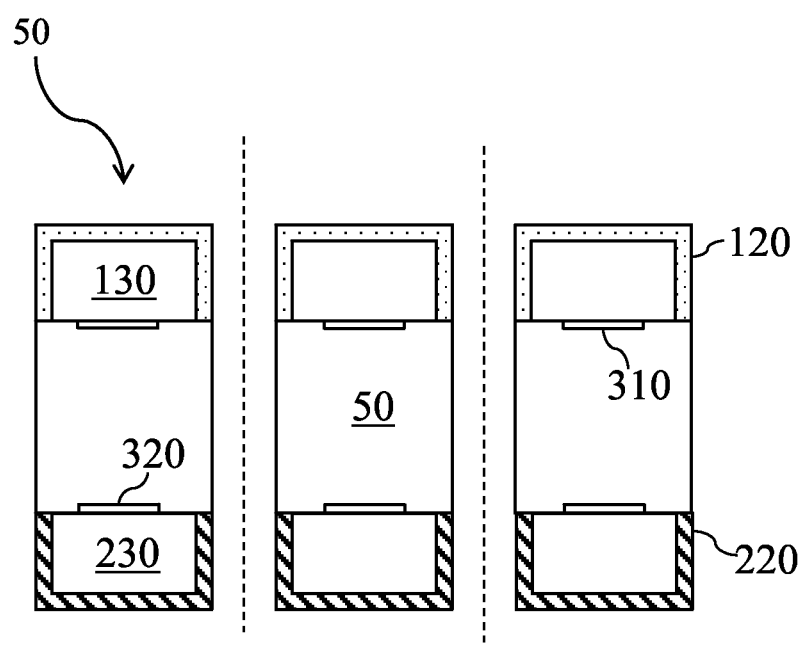
FIG. 8 illustrates a cross-sectional view of a semiconductor package after singulation in accordance with embodiments of the invention.

FIG. 8 illustrates a cross-sectional view of a semiconductor package after singulation in accordance with embodiments of the invention.

The substrate 300 may be singulated through the dicing channels as illustrated by the dashed lines. Prior to singulation, the substrate 300 with the semiconductor packages may be placed on a foil in one or more embodiments. Alternatively, the semiconductor packages may be placed on a foil after singulation as will be described in FIG. 9. In one embodiment, the singulation may be performed mechanically, for example, using a grinding wheel. In an alternative embodiment, the singulation may be performed chemically, for example, using an anisotropic etching process. In a further embodiment, the singulation may be performed using a laser process. In various embodiments, the singulation may be performed using a combination of mechanical, chemical, and/or laser process. The first bump 110 and the second bump 210 behave as etch mask protecting the underlying substrate 300. Thus, after the singulation, chips 50 are generated, which are also referred as bulk if they are in loose form. The bulk chips 50 if produced may be subsequently packaged in various ways. Alternatively, the individual chips 50 may remain attached to the tape on which they are being processed.

Figure 9:
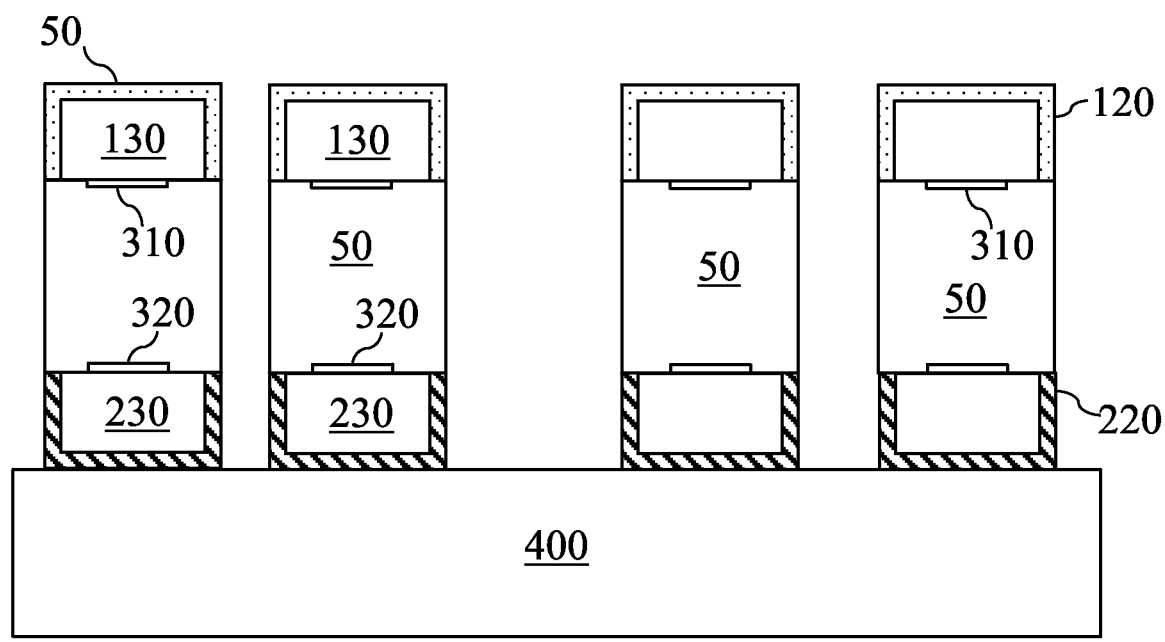
FIG. 9 illustrates a plurality of semiconductor chips packaged over a tape and reel in accordance with an embodiment of the invention.

FIG. 9 illustrates a plurality of semiconductor chips packaged over a tape and reel in accordance with an embodiment of the invention.

The singulated chips 50 may be fed into a sorter such as a bowlfeeder handler. Conventionally, the bowlfeeder handler may perform further tests (typically basic functionality tests) and may attach the chips 50 on to a tape sequentially.

Conventionally, the separated chips are individually picked, tested and the good (not defective) units are placed onto a carrier tape (or other suitable substrate) during packaging. However, such a process is time consuming and may become the bottleneck for the overall production.

Advantageously, using embodiments of the present invention, the sorter may easily distinguish the top and bottom sides of the chip 50 because of the differences in magnetic properties of the first bump 110 and the second bump 210. Similarly, in another embodiment, the optical differences between the first bump 110 and the second bump 210 may be used to distinguish the different contacts of the chip 50. Accordingly, referring to FIG. 9, the chips 50 are placed over a tape and reel layer 400.

In various embodiments of the present invention, advantageously, testing may be performed as a batch process. If the chip 50 is placed on a singulation foil prior to dicing, batch testing may be performed directly. Alternatively, in one embodiment, testing may be performed using a batch process after attaching the chips 50 to the tape. In other words, in various embodiments, a wafer test process may be used instead of testing each chip 50 sequentially.

In various embodiments, the chips 50 are placed such that all the first bumps 110 face upwards. In an alternative embodiment, the chips 50 may be placed such that all the second bumps 210 face upwards away from the tape and reel layer 400. In various embodiments, the placement of the chips 50 may be facilitated using a magnetic sorting process. In various embodiments, either all the first bumps 110 or all the second bumps 210 are magnetic. In one embodiment, all of the first bumps 110 may be oriented in one direction by using the magnetic property of the first bump 110. Therefore, a magnetic sorter can lift the chips 50 using the magnetic bump.

FIGS. 10-13 illustrate cross-sectional views of a semiconductor device during various stages of fabrication in accordance with an alternative embodiment of the present invention.

Embodiments of the present invention may also be applied to semiconductor package comprising more than one semiconductor chip.

FIG. 10 illustrate a cross-sectional view of a semiconductor device after forming a reconstituted wafer comprising multiple chips in accordance with an alternative embodiment of the present invention.

Referring to FIG. 10, a reconstituted wafer 500 comprising a first chip 51, a second chip 52, and a third chip 53 is formed. In various embodiments, the first chip 51, the second chip 52, and the third chip 53 may be different or same type of chips and may be formed in different processes and facilities. For example, in one embodiment, the first chip 51 and the third chip 53 may comprise discrete power semiconductor chips while the second chip 52 may comprise an integrated circuit chip. In other embodiments, the first chip 51, the second chip 52, and the third chip 53 comprise discrete vertical semiconductor chips. The first chip 51, the second chip 52, and the third chip 53 are embedded within an encapsulant 510 to form the reconstituted wafer 500. In various embodiments, a plurality of the first chips 51, a plurality of the second chips 52, and a plurality of third chips 53 are formed within the encapsulant 510.

FIG. 11 illustrate a cross-sectional view of a semiconductor device after attaching a first bump-frame and a second bump-frame to the reconstituted wafer in accordance with an alternative embodiment of the present invention.

In one or more embodiments, front side and back side redistribution layers may be formed over and under the reconstituted wafer 500. A first redistribution layer 505 is formed over the reconstituted wafer 500. The first contact pads 310 may be coupled through first redistribution metal lines 520. For example, a pad of the first contact pads 310 at the first chip 51 may be coupled to another pad of the first contact pads 310 at the second chip 52. Similarly, the second contact pads 320 on the opposite side of the reconstituted wafer 500 are coupled through second redistribution metal lines 540 in the second redistribution layer 515.

As described previously with respect to FIG. 6, a first bump-frame 105 is attached to the first contact pads 310 while a second bump-frame 205 is attached to the second contact pads 320. The first bumps 110 may be attached to the first contact pads 310 by a solder joint in various embodiments. Similarly, the second bumps 210 may be attached to the second contact pads 320 by a solder joint. The first bump-frame 105 and the second bump-frame 205 may be attached using pressure and/or thermal energy as described previously.

Further, the first bumps 110 may be soldered to more than one of the first contact pads 310. For example, as a consequence, a pad on the first chip 51 may be coupled to a pad on the second chip 52 through a common first bump 110. Similarly, a pad on the third chip 53 may be coupled to a pad on the second chip 52. Thus, the second chip 52 and the third chip 53 may be coupled through another common first bump 110. Similarly, the second bumps 210 may be soldered to more than one of the second contact pads 320.

In various embodiments, advantageously, correctly positioning the first bump-frame 105 (second bump-frame 205) over the reconstituted wafer 500 ensures the appropriate positioning of the first bumps 110 (second bumps 210).

Figure 12:
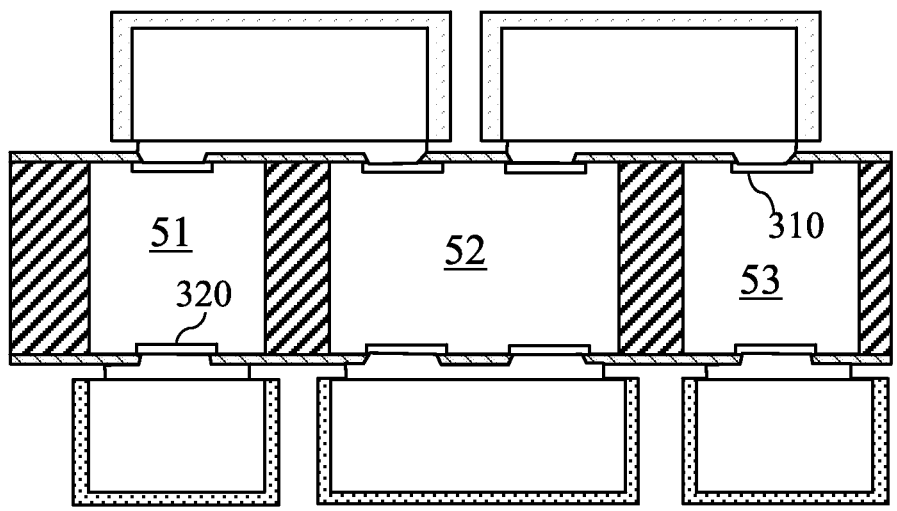
FIG. 12 illustrate a cross-sectional view of a semiconductor device after dicing the reconstituted wafer with the attached bump-frames in accordance with an alternative embodiment of the present invention.

FIG. 12 illustrate a cross-sectional view of a semiconductor device after singulating the reconstituted wafer with the attached bump-frames in accordance with an alternative embodiment of the present invention.

The reconstituted wafer 500 is singulated to form a semiconductor package comprising multiple chips. In various embodiments, the singulation may be performed using a combination of mechanical, chemical, and/or laser processes. As in prior embodiments, the first bumps 110 and the second bumps 210 may provide a etch mask for the singulating process if performed using wet etching. Alternatively, the reconstituted wafer 500 may be singulated mechanically in some embodiments. In further embodiments, the reconstituted wafer 500 may be singulated using a laser process such as carbon dioxide laser process or even a stealth laser process in some embodiments.

Figure 13:
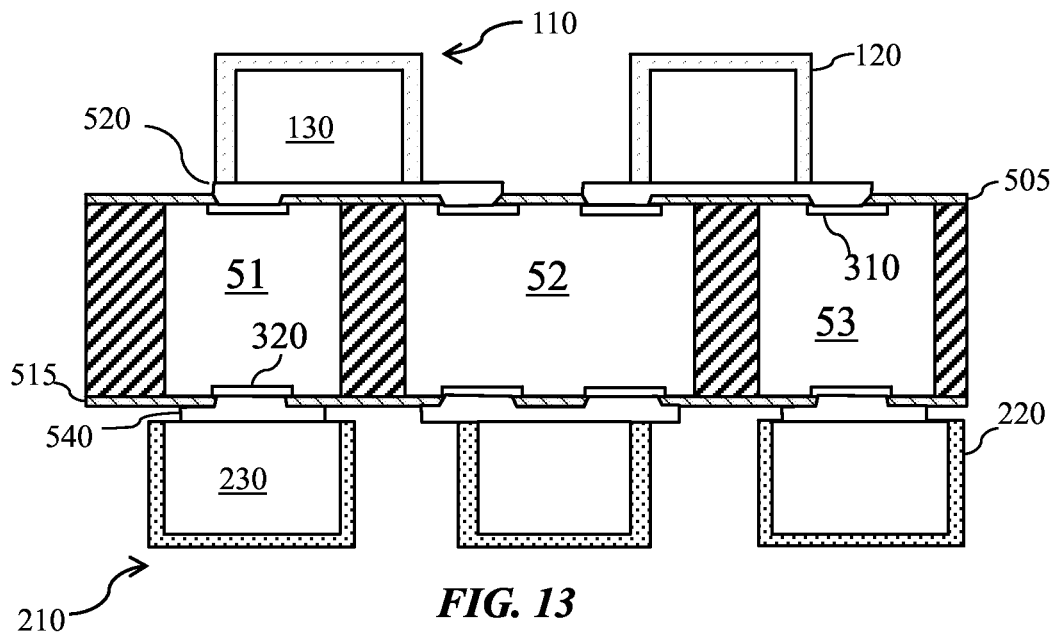
FIG. 13 illustrates a semiconductor package in which the bumps do not cover the redistribution layer completely in accordance with a further alternative embodiment of the present invention.

FIG. 13 illustrates a further alternative embodiment in which the bumps do not cover the redistribution layer completely.

In this embodiment, the first bump 110 may not cover both the first contact pad 310 on the first chip 51 and the first contact pad 310 on the second chip 52. Rather, these contact pads are coupled through the first redistribution layer 505, which includes first redistribution metal lines 520. Similarly, the second contact pads 320 on the opposite side of the reconstituted wafer 500 are coupled through second redistribution metal lines 540 in the second redistribution layer 515.

Figure 14:
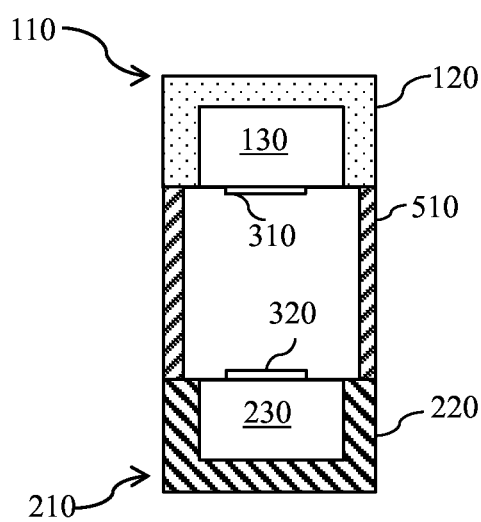
FIG. 14 illustrates a further alternative embodiment in which each semiconductor package comprises a single chip embedded in an insulating material.

FIG. 14 illustrates a further alternative embodiment in which each semiconductor package comprises a single chip unlike the embodiments described above with respect to FIGS. 10-12. Thus, in FIG. 14, the chip 50 is encapsulated by the encapsulant 510 while the first bump 110 and the second bump 210 are formed above and below the encapsulated chip 50.

Figure 15:
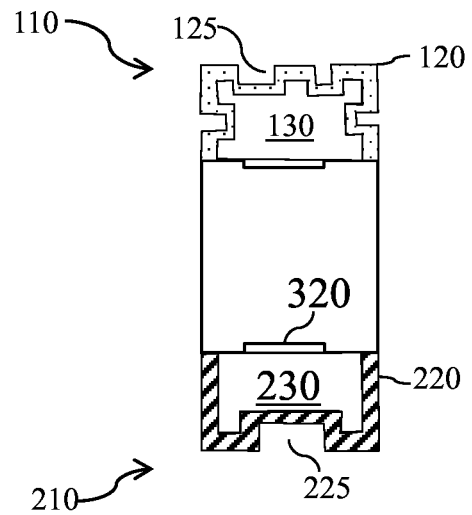
FIG. 15 illustrates a further alternative embodiment in which the bumps comprise grooves to improve solder joint area.

FIG. 15 illustrates a further alternative embodiment in which the bumps comprise grooves to improve solder joint area.

In various embodiments, the first bump 110 and the second bump 210 may include patterns such as first grooves 125 or a second groove 225. In various embodiments, the grooves or patterns on the first bump material 130 or the second bump material 230 may get transferred on to the first solder layer 120 or the second solder layer 220 due to the conformal nature of the electroplating process used to deposit these solder layers. These patterns may be used to increase the surface area of the first bump 110 and/or the second bump 210. As a consequence the semiconductor package may be soldered to a circuit board with better adhesion due to the larger solder joint area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-15 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
    a first semiconductor chip having a first contact pad on a first major surface;
    a first bump disposed on the first contact pad; and
    a first solder layer disposed on sidewalls of the first bump, the first solder layer being disposed on all four sidewalls and a top surface of the first bump;
    a second bump disposed on a second contact pad of the first semiconductor chip, the second contact pad disposed on a second major surface opposite the first major surface; and
    a second solder layer disposed on sidewalls of the second bump;
    an encapsulant disposed around the first semiconductor chip; and
    a second semiconductor chip disposed in the encapsulant proximate the first semiconductor chip, wherein the second semiconductor chip comprises a third contact pad on the first major surface and a fourth contact pad on the second major surface.

2. The package of claim 1, wherein the first bump comprises a ferromagnetic material.

3. The package of claim 2, wherein the ferromagnetic material comprises nickel, cobalt, chromium, and/or iron.

4. The package of claim 1, wherein the first solder layer comprises gold, silver, platinum, tin, nickel, tin-lead, and/or zinc alloys.

5. The package of claim 1, wherein the first semiconductor chip comprises a discrete vertical transistor.

6. The package of claim 1, further comprising an encapsulant disposed around the first semiconductor chip.

7. The package of claim 1, wherein the first solder layer is disposed on all four sidewalls and a top surface of the first bump, and wherein the second solder layer is disposed on all four sidewalls and a top surface of the second bump.

8. The package of claim 1, wherein the second bump is a different material from the first bump.

9. The package of claim 1, wherein the first bump comprises a ferromagnetic material, and wherein the second bump comprises a non-magnetic material.

10. The package of claim 9, wherein the non-magnetic material comprises copper, silver, and/or gold.

11. The package of claim 1, further comprising:
    a third bump disposed on the third contact pad;
    a third solder layer disposed on sidewalls of the third bump;
    a fourth bump disposed on the fourth contact pad; and
    a fourth solder layer disposed on sidewalls of the fourth bump.

12. The package of claim 11, wherein the third solder layer is disposed on all four sidewalls and a top surface of the third bump, and wherein the fourth solder layer is disposed on all four sidewalls and a top surface of the fourth bump.

13. A semiconductor device comprising:
    a semiconductor chip having a first contact pad on a first major surface and a second contact pad on a second major surface;
    a magnetic bump disposed on the first contact pad, the magnetic bump exposed to provide electrical contact with an external surface; and
    a non-magnetic bump disposed on the second contact pad, the non-magnetic bump exposed to provide electrical contact with another external surface, wherein the magnetic bump over the first major surface is magnetic and the non-magnetic bump under the second major surface is not magnetic.

14. The device of claim 13, wherein sidewalls of the magnetic bump comprise a first solder layer; and
    wherein sidewalls of the non-magnetic bump comprise a second solder layer.

15. The device of claim 14, wherein all four sidewalls and a top surface of the magnetic bump comprise the first solder layer.

16. The device of claim 15, wherein all four sidewalls and a top surface of the non-magnetic bump comprise the second solder layer.

17. The device of claim 13, wherein the magnetic bump comprises nickel, cobalt, chromium, and/or iron, and wherein the non-magnetic bump comprises copper, silver, and/or gold.

18. A semiconductor package comprising:
    a first semiconductor chip having a first contact pad on a first major surface and a second contact pad on a second major surface, wherein the first major surface is opposite the second major surface;
    a first side contact comprising a first bump disposed over the first contact pad and a first solder layer covering the first bump; and
    a second side contact comprising a second bump disposed over the second contact pad and a second solder layer covering the second bump, the second side contact comprising a different magnetic property than the first side contact, wherein the first solder layer and the second solder layer are exposed to provide a contact surface for electrically contacting the first semiconductor chip.

19. The package of claim 18, wherein the first bump comprises a ferromagnetic material and the second bump comprises a non-magnetic material.

20. The package of claim 19, wherein the ferromagnetic material comprises nickel, cobalt, chromium, and/or iron, wherein the first solder layer and the second solder layer comprise gold, silver, platinum, tin, nickel, tin-lead, and/or zinc alloys, wherein the non-magnetic material comprises copper, silver, and/or gold.

21. The package of claim 18, wherein the first bump and the second bump comprise a different material, and wherein the first solder layer and the second solder layer comprise the same material.

22. A semiconductor structure comprising:
    a semiconductor chip having a first major surface and a second major surface opposite the first major surface;
    a plurality of first bumps disposed over the first major surface; and
    a plurality of second bumps disposed under the second major surface, wherein the plurality of first bumps and the plurality of second bumps are exposed, wherein the plurality of first bumps over the first major surface is magnetic and the plurality of second bumps under the second major surface is not magnetic.

23. The semiconductor structure of claim 22, further comprising:
    an encapsulant disposed around the first semiconductor chip; and
    a second semiconductor chip disposed in the encapsulant proximate the first semiconductor chip.

24. The semiconductor structure of claim 23, wherein the plurality of first bumps and the plurality of second bumps provide electrical connectivity to the first semiconductor chip and the second semiconductor chip.

25. The semiconductor structure of claim 22, wherein the plurality of first bumps comprises a ferromagnetic material, and wherein the plurality of second bumps comprises a non-magnetic material.

26. The semiconductor structure of claim 22, wherein the plurality of first bumps comprises nickel, cobalt, chromium, and/or iron, and wherein the plurality of second bumps comprises copper, silver, and/or gold.

27. The semiconductor structure of claim 22, wherein all sidewalls of the plurality of first bumps comprise a solder layer, and wherein all sidewalls of the plurality of second bumps comprise another solder layer.

* * * * *